United States Patent [19]

Su

[11] Patent Number: 5,589,002
[45] Date of Patent: Dec. 31, 1996

[54] GAS DISTRIBUTION PLATE FOR SEMICONDUCTOR WAFER PROCESSING APPARATUS WITH MEANS FOR INHIBITING ARCING

[75] Inventor: Yuh-Jia Su, Cupertino, Calif.

[73] Assignee: Applied Materials, Inc., Santa Clara, Calif.

[21] Appl. No.: 217,467

[22] Filed: Mar. 24, 1994

[51] Int. Cl.⁶ .................................................. C23C 16/00
[52] U.S. Cl. ................ 118/723 E; 156/345; 204/298.07; 204/298.33
[58] Field of Search ............................ 118/723 R, 723 E, 118/723 ER, 715; 219/121.4, 121.51, 121.52, 121.55; 204/298.07, 298.31, 298.33, 298.39, 280, 284; 156/345; 315/111.21, 111.31

[56] References Cited

U.S. PATENT DOCUMENTS

| 4,590,042 | 5/1986 | Drage ................................... 422/186.06 |
| 4,612,077 | 9/1986 | Tracy ..................................... 156/345 |
| 4,612,432 | 9/1986 | Sharp-Geisler ................... 219/121 PG |
| 4,780,169 | 10/1988 | Stark ..................................... 156/345 |
| 5,006,220 | 4/1991 | Hijikata ............................... 204/298.33 |
| 5,074,456 | 12/1991 | Degner ................................... 228/121 |
| 5,180,467 | 1/1993 | Cook ..................................... 156/643 |
| 5,248,371 | 9/1993 | Maher ................................... 156/345 |
| 5,445,699 | 8/1995 | Kamikawa ............................ 156/345 |
| 5,449,410 | 9/1995 | Chang ............................... 118/723 ER |

FOREIGN PATENT DOCUMENTS

| 104625 | 5/1986 | Japan ................................. 204/298.33 |
| 208222 | 9/1986 | Japan ..................................... 118/723 E |
| 13573 | 1/1987 | Japan ..................................... 118/723 E |
| 60875 | 3/1987 | Japan ..................................... 118/723 E |
| 149964 | 6/1989 | Japan ..................................... 118/723 E |
| 166728 | 7/1993 | Japan ..................................... 118/723 R |

*Primary Examiner*—Robert Kunemund
*Assistant Examiner*—Jeffrie R. Lund
*Attorney, Agent, or Firm*—John P. Taylor

[57] ABSTRACT

A gas distribution plate for a semiconductor wafer process chamber has a symmetrical pattern of non-circular openings formed therein for the passage of gas therethrough. The smaller axis of the non-circular openings should be at least about 127 μm (5 mils), and preferably at least about 254 μm (10 mils), but less than about 762 μm (30 mils), and preferably less than about 635 μm (25 mils). The larger axis is greater than the smaller axis, preferably at least about 635 μm (25 mils), and most preferably at least about 762 μm (30 mils). At least some of the walls of the non-circular openings are preferably not perpendicular to the plane of the face of the gas distribution plate, but are rather slanted, at an angle of from at least 30° to less than 90°, toward the center or axis of the outer face of the circular gas distribution plate which faces the wafer. Arcing on the face of the gas distribution plate may be further inhibited by providing peripheral conductive means on the face of the gas distribution plate electrically connected to grounded or neutral portions of the processing chamber to thereby provide a conductive path for unstable plasma at the surface of the gas distribution plate.

28 Claims, 3 Drawing Sheets

GAS DISTRIBUTION PLATE FOR SEMICONDUCTOR WAFER PROCESSING APPARATUS WITH MEANS FOR INHIBITING ARCING

BACKGROUND OF THE INVENTION

1. Field of the Invention

This invention relates to apparatus for processing semiconductor wafers, including an improved gas distribution plate used to introduce gas into a semiconductor processing chamber. More particularly, this invention relates to a gas distribution plate used to introduce gas into a semiconductor wafer processing chamber, which serves as an electrode when plasma processing is carried out in the chamber, and which contains means for inhibiting arcing at the gas distribution plate surface and means for inhibiting blockage of process gases passing through the gas distribution plate to the processing chamber.

2. Description of the Related Art

In the processing of semiconductor wafer, for example, to etch the wafer or to deposit a layer on material on the wafer surface, one or more gases are introduced into the processing chamber through openings in a gas distribution plate facing the wafer surface being processed. To assist in such etching or deposition, a plasma is often ignited in the chamber between the gas distribution plate and the wafer, for example, by electrically connecting the gas distribution plate to an RF power source, while grounding the metal walls of the chamber, as well as the wafer support on which the wafer rests during such processing.

The openings in the gas distribution plate, through which the processing gas flows into the chamber, are conventionally arranged in a symmetrical pattern of circular holes which are generally all of the same diameter to ensure even flow and distribution of the gases into the chamber. FIG. 1 shows such a prior art gas distribution plate 2 having a symmetrical arrangement of circular openings 4 formed therein.

While such a symmetrical pattern of identical circular openings generally serves to provide an even distribution of gas flow into the processing chamber, problems have been encountered with such circular openings. It has been found, for example, that the diameter of the circular openings must be maintained within a certain range which is not always convenient for the amount of desired gas flow into the processing chamber. If the diameter of the circular openings is less than about 508 micrometers (μm) or 0.020 inches (20 mils), the formation of by-products, by reaction of the halogen-containing plasmas with the wafer and/or chamber wall, will often result in blockage of at least some of the holes, resulting in either a reduced gas flow, or an unevenly distributed gas flow, or both, which may, in turn, affect process results.

On the other hand, the obvious solution to a blockage problem, i.e., increasing the diameter of the circular holes, can result in arcing on the gas distribution plate caused by the unstable plasma which can either flow along the face of the plate, or go into the gap between the plate and the lid or top of the processing chamber, if the diameter of the circular holes is about 762 μm (30 mils) or larger. This leaves a margin of less than about 254 μm (10 mils) in hole diameter between potential blockage of the openings, if the openings are too small, and potential arcing if the openings are too large.

It would, therefore, be desirable to provide a semiconductor processing apparatus suitable for use with plasma processing wherein the gas distribution plate of the apparatus was provided with a pattern of openings therein of sufficient size and shape to permit the flow of gas therethrough into the chamber, without blockage of the openings, regardless of the type of plasma generated in the chamber, while still inhibiting arcing of the plasma on the surface of the gas distribution plate and with a larger dimensional margin of opening sizes.

SUMMARY OF THE INVENTION

The invention comprises a semiconductor process chamber with a gas distribution plate having a symmetrical pattern of non-circular openings formed therethrough for the passage of gas therethrough. The smaller axis of the non-circular openings should be at least about 127 μm (5 mils), and preferably at least about 254 μm (10 mils), but less than about 762 μm (30 mils), and preferably less than about 635 μm (25 mils). The larger axis is greater than the smaller axis, preferably at least about 635 μm (25 mils), and most preferably at least about 762 μm (30 mils). In a preferred embodiment, at least some of the walls of the non-circular openings are not perpendicular to the plane of the face of the gas distribution plate, but are rather slanted, at an angle of from at least 30° to less than 90°, toward the center or axis of the outer face of the circular gas distribution plate which faces the wafer.

In another preferred embodiment, arcing around the gas distribution plate is further inhibited by providing peripheral conductive means on the face of the gas distribution plate electrically connected to grounded portions of the processing chamber to thereby provide a path to ground for unstable plasma at the surface of the gas distribution plate.

DETAILED DESCRIPTION OF THE INVENTION

Figure 1:
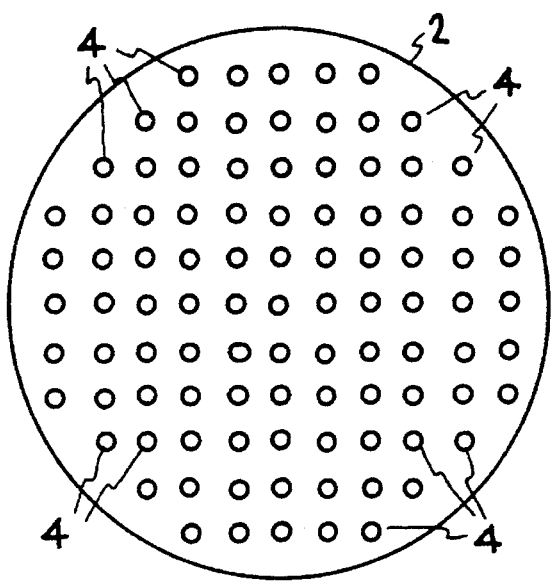
FIG. 1 is a top view of the pattern of circular openings arranged in a symmetrical pattern in a prior art gas distribution plate.
Figure 2:
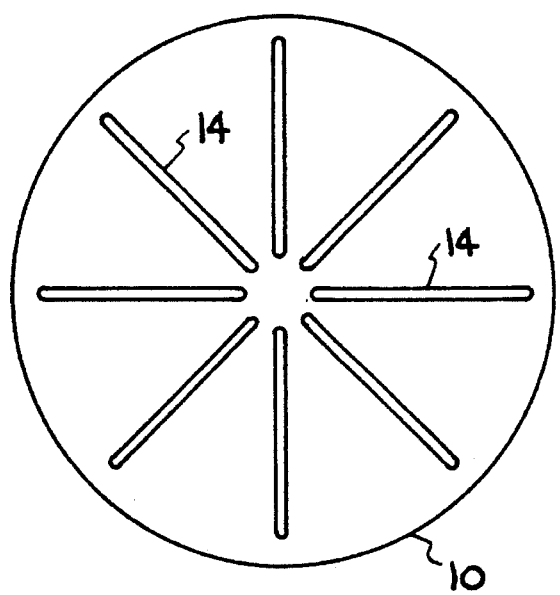
FIG. 2 is a top view of a symmetrical pattern of non-circular openings formed in a gas distribution plate of the invention.
Figure 3:
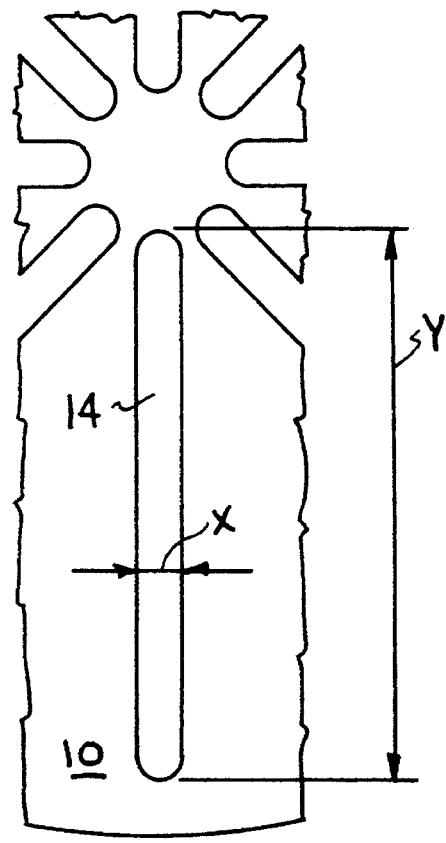
FIG. 3 is a fragmentary enlarged top view of a portion of the gas distribution plate of FIG. 2 showing the width and length of one of the non-circular openings.

Turning now to FIGS. 2 and 3, one embodiment of the improved gas distribution plate of the invention is shown. In this embodiment, a circular gas distribution plate 10 is provided with a series of elongated slots 14, i.e., non-circular openings, arranged in a star-like pattern with the major axis of each slot passing through the center point or axis of plate 10. As best seen in FIG. 3, each slot has a major axis Y and a minor axis X. The minimum length Y of each slot 14 should be greater than the maximum width X of slot 14, and should be at least about 635 µm (25 mils), preferably at least about 762 µm (30 mils). The maximum length Y of slot 14 is governed only by the size (diameter) of plate 10. That is, the maximum length Y of slot 14 must be less than the radius of plate 10. The minimum width X of slot 14 should be at least about 127 µm (5 mils) and preferably will be at least about 254 µm (10 mils) to inhibit blockage of gases passing therethrough. The maximum width X of slot 14, however, will be less than 762 µm (30 mils), and preferably will be less than about 635 µm (25 mils) to inhibit arcing.

Such elongated and non-circular slots 14 have been found to provide an adequate opening for the passage of gas therethrough without blockage and without resulting in arcing from an oversize opening as was experienced with circular slots which exceeded 762 µm (30 mils) in diameter.

Figure 4:
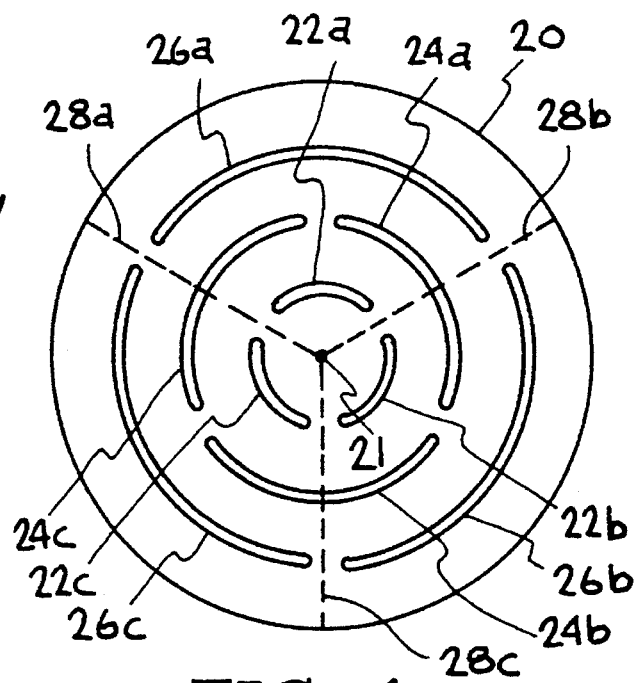
FIGS. 4–6 are top views of other symmetrical patterns of non-circular openings formed in gas distribution plates of the invention.

FIG. 4 shows another embodiment of the invention wherein a gas distribution plate 20 is provided with non circular openings which are in the form of arcs or arcuate slots of various radii coaxially arranged on circular gas distribution plate 20 with respect to center 21 of plate 20. In the illustrated embodiment, three arcuate slots 22a, 22b, and 22c are provided in an inner circular arrangement coaxial with the center of plate 20, with each arcuate slot occupying just less than 120° (so that the slots are separated from one another). Three arcuate slots 24a, 24b, and 24c are similarly arranged in a second coaxial circle of larger radius than that defined by arcuate slots 22a, 22b, and 22c; and three arcuate slots 26a, 26b, and 26c are coaxially provided in the largest of the three circles. It will, of course, be understood that more (or less) than three circles of arcuate slots may be provided if desired and/or needed to provide sufficient and uniform distribution of the gas flowing through the arcuate slots into the processing chamber. It should also be noted that more than three arcuate slots may be provided in each circle, provided that symmetry is maintained to thereby permit even distribution of the gas through the slots into the chamber.

Furthermore, as shown in FIG. 4, in this embodiment the three respective gaps between the three arcuate slots lying in the smallest circle preferably will be aligned with the three respective gaps between the three arcuate slots lying in the largest circle; and the three respective gaps between the arcuate slots lying in the middle circle will be rotated 60° from the gaps between the respective slots in the one innermost and outermost circles. The centers of the respective gaps between the three arcuate slots lying in the innermost and outermost circles will then be positioned on respective radii which intersect the midpoint of the corresponding arcuate slots lying in the middle circle, as shown in the dotted lines 28a, 28b, and 28c in the preferred arrangement of this embodiment.

As in the previous embodiment, the width of each of the arcuate slots should range from a minimum of at least about 127 µm (5 mils), and preferably at least about 254 µm (10 mils), to inhibit blockage of gases passing therethrough; up to a maximum width of less than 762 µm (30 mils), and preferably less than about 635 µm (25 mils) to inhibit arcing.

The range of circumferential length of the arcuate slots will, of course be dependent upon which of the three circles the particular arcuate slot lies in. However, the minimum length of all of the slots, regardless of which circle the slots lie in, will be greater than the width of the slots and at least greater than about 635 µm (25 mils), and preferably at least greater than about 762 µm (30 mils).

The maximum circumferential length of each of the three arcuate slots lying in each circle will be less than $\frac{1}{3}$ of the diameter of that circle. Thus, for example, when three circles of three arcuate slots each are provided, with the midpoint of the respective widths of the slots equidistant from one another as well as from the outer edge and the center of the circular gas distribution plate, as in the illustration of FIG. 4, the maximum circumferential length of each of the three arcuate slots lying in the inner or smallest circle (slots 22a, 22b, and 22c) will be less than $\frac{1}{3}\pi$ ($\frac{1}{4}$D), where D is the diameter of the gas distribution plate; the maximum circumferential length of each of the three arcuate slots lying in the middle circle (slots 24a, 24b, and 24c) will be less than $\frac{1}{3}\pi$ ($\frac{1}{2}$D); and the maximum circumferential length of each of the three arcuate slots lying in the outermost circle (slots 26a, 26b, and 26c) will be less than $\frac{1}{3}\pi$ ($\frac{3}{4}$D). Of course, if more or less than three arcuate slots are used in each circle, the maximum length of each arcuate slot will be modified accordingly. For example, if four arcuate slots were provided in the innermost of three circles, the maximum length of each would be less than $\frac{1}{4}\pi$ ($\frac{1}{4}$D).

Figure 5:
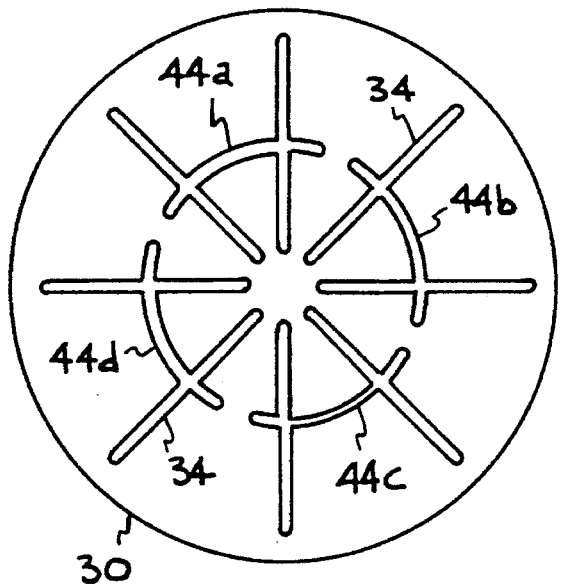

FIG. 5 illustrates yet another embodiment which incorporates the features of the embodiment of FIGS. 2 and 3 with some features similar to the arcuate slots of the embodiment of FIG. 4. Thus, gas distribution plate 30 of FIG. 5 is provided with radiating slots 34 having the same range of dimensions as slots 14 of FIG. 2 and 3; and coaxially positioned arcuate slots 44a, 44b, 44c, and 44d having, in the preferred arrangement of this embodiment, the same width dimensions as arcuate slots 24a, 24b, and 24c of the embodiment of FIG. 4, and each having a length of less than $\frac{1}{4}\pi$ (xD), where the value of x would depend upon the diameter of the circle defined by the coaxially positioned arcuate slots 44a–44d and D is the diameter of gas distribution plate 30. As shown in FIG. 5, preferably each of the four arcuate slots 44a–44d would have a maximum length of less than $\frac{1}{4}\pi$ ($\frac{1}{2}$D), i.e., the diameter of the circle defined by arcuate slots 44a–44d would be half of the diameter D of gas distribution plate 30 so that arcuate slots 44a–44d would be equidistance from the center and outer edge of plate 30.

Figure 6:
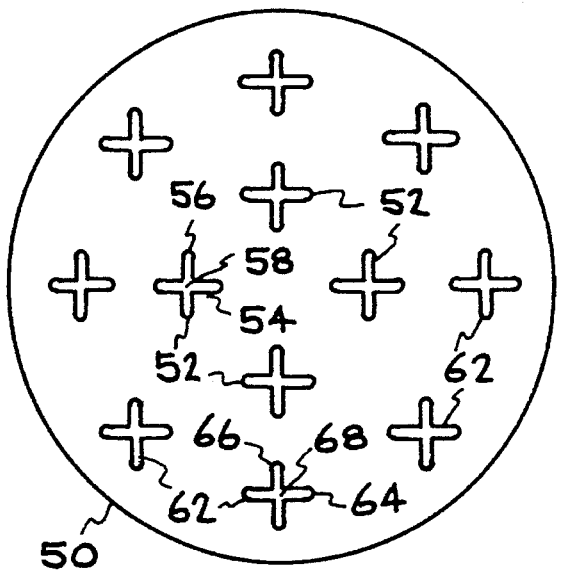

Yet another embodiment is shown in FIG. 6, wherein gas distribution plate 50 is provided with crossed slots 52 and 62, with the intersections of the respective crossed slots lying in either a smaller or larger circle around the midpoint of plate 50. Thus, each of the four crossed slots 52 having intersections lying along the inner circle comprise a horizontal slot 54, a vertical slot 56, and an intersection 58; while each of the eight crossed slots 62 having intersections lying along the outer circle comprise a horizontal slot 64, a vertical slot 66, and an intersection 68.

As in the embodiment of FIGS. 2 and 3, the respective width of slots 54, 56, 64, and 66 should be at least about 127 µm (5 mils) and preferably will be at least about 254 µm (10 mils) to inhibit blockage of gases passing therethrough; while the maximum width of the slot, however, will be less than 762 µm (30 mils), and preferably less than about 635 µm (25 mils) to inhibit arcing.

The respective lengths of slots 54, 56, 64, and 66 will be at least greater than the maximum width of the slots, and should be at least about 635 μm (25 mils), preferably at least about 762 μm (30 mils). The maximum length of slots 54, 56, 64, and 66 will depend upon the overall dimensions of plate 50, but will preferably each not exceed about ¼ of the radius of plate 50.

Although it is preferable that all of the slots be of the same length and width, to preserve symmetry and resultant uniform delivery of gas through the openings into the chamber, it is not necessary that the lengths and widths be identical as long as the respective lengths and widths of the slots define a symmetrically pattern which will provide the desired uniform delivery of gas into the chamber.

When two circles of crossed slots are used, as in the illustrated structure of FIG. 6 of this embodiment, intersections 58 of inner crossed slots 52 should preferably lie along a circle having a diameter of about ⅓ of the diameter of plate 50, while intersections 68 of outer crossed slots 62 should preferably lie in a circle having a diameter of about ⅔ of the diameter of plate 50, to provide optimum symmetrical spacing of the respective crossed slots on pate 50. It will be appreciated that more than two circular arrangements of such crossed slots may be used, as long as a symmetrical arrangement is used which will provide uniform gas distribution therethrough into the processing chamber.

Figure 7:
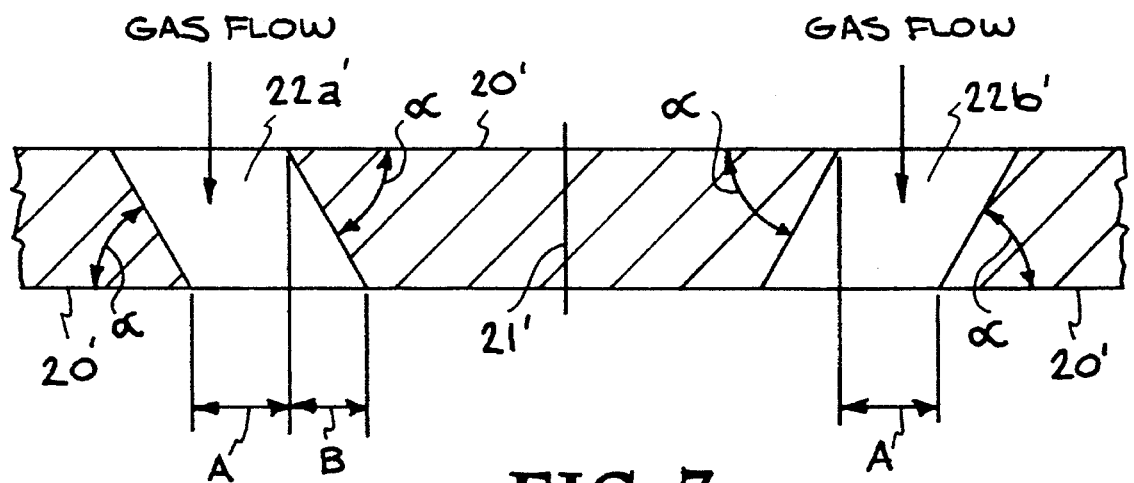
FIG. 7 is a fragmentary vertical cross-sectional view of a portion of a gas distribution plate similar to the embodiments shown in FIGS. 4 and 5, but showing another embodiment of the invention wherein some of the walls of the non-circular openings are not formed perpendicular with the plane of the face of the gas distribution plate of the invention.

Turning now to FIG. 7, a further embodiment is shown comprising a modification of the embodiments of FIGS. 4 and 5, wherein the arcuate slots, i.e., the slots which perpendicularly intersect a radius of the gas distribution plate, are provided with slanted or angled sidewalls, rather than sidewalls perpendicular to the face of the gas distribution plate. By providing such angled sidewalls, i.e., slanted across the width or shorter dimension of the slot, the total width of the arcuate slot (A+B in FIG. 7) may be made wider than the maximum permitted width of a perpendicular slot without increasing the risk of arcing as long as the lateral width (A in FIG. 7) does not exceed the previously recited maximum width of the slots, i.e., is less than 762 μm (30 mils), and preferably less than about 635 μm (25 mils).

Thus, as shown in FIG. 7, arcuate slots 22a' and 22b' are shown formed in gas distribution plate 20' with sidewalls sloped at an angle α with respect to the surface of plate 20', where angle α is at least 30°, but is less than 90°, and preferably ranges from about 45° to about 75°. The sidewalls of arcuate slots 22a' and 22b' are angled toward center point 21' of gas distribution plate 20' on the delivery side of the plate, i.e., the face of the plate facing the wafer to be processed.

When such arcuate slots are formed with slanted sidewalls, the total width of slot 22a' (or slot 22b') is A+B, but the lateral width is only A. Thus, it will be seen that when the above discussed maximum lateral width A is maintained for slanted slots 22a' and 22b' (to inhibit arcing), the overall width A+B may exceed this value, thus increasing the overall gas flow through the slots without, however, increasing the risk of undesirable arcing. It should be noted that there is no minimum value of A, since distribution plate 20' may be made thick enough so that the entire lateral width of the slot comprises the value of B.

Figure 8:
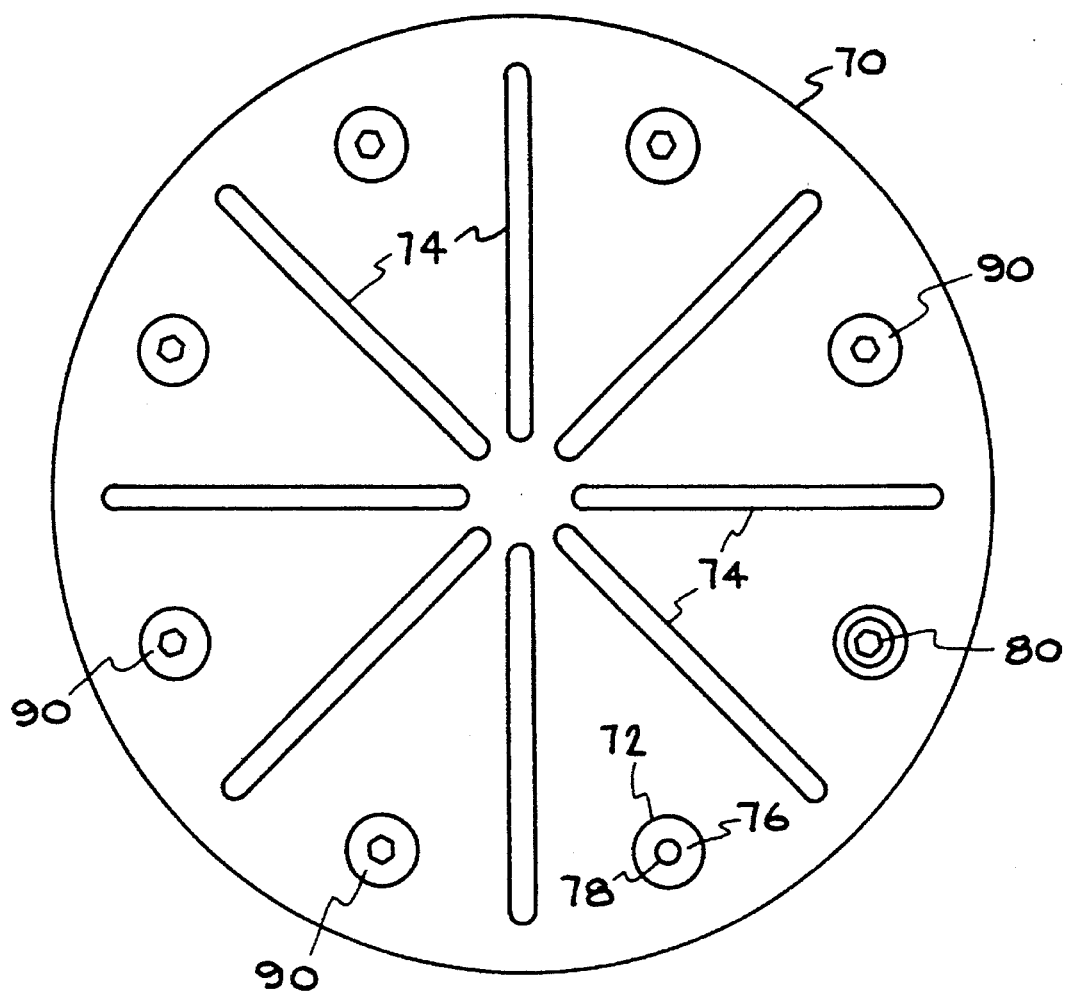
FIG. 8 is a top view of another aspect of the invention wherein conductive members are placed in the peripheral openings formed in the face of the gas distribution plate to receive mounting bolts which secure the plate to the lid or top of the processing chamber.
Figure 9:
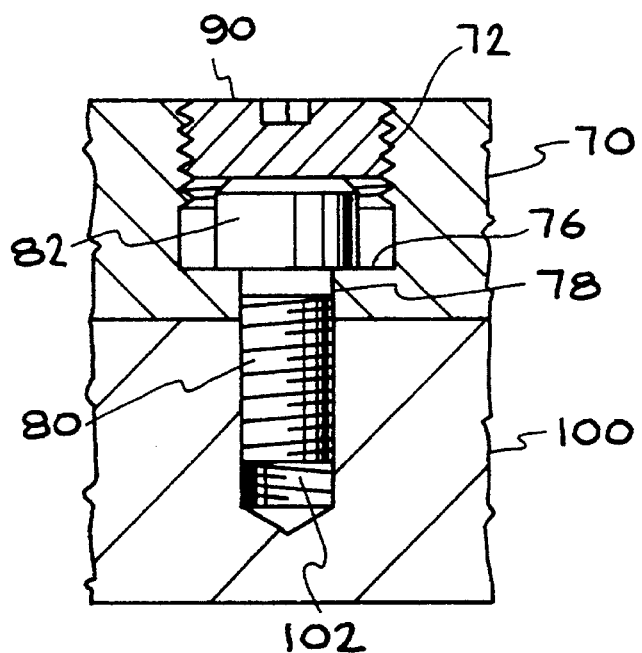
FIG. 9 is a fragmentary vertical cross-sectional view of a portion of the gas distribution plate structure of FIG. 8 showing one of the conductive members mounted in the bore which receives a mounting bolt to secure the gas distribution plate to the lid or top of the processing chamber.

Turning now to FIGS. 8 and 9, yet another embodiment of the invention is illustrated which may be incorporated into the design of the gas distribution plate as a supplement to any of the previously described embodiments, or even used independently in the construction and use of the gas distribution plate, i.e., with a conventional gas distribution plate.

In this embodiment, a gas distribution plate 70, which may optionally be provided with slots 74 similar to the embodiment of FIG. 2, is provided with openings or bores 72 to receive threaded mounting bolts 80 therein to secure plate 70 to a top plate 100 of the processing chamber which may constitute a removable lid or cover. As best seen in FIG. 9, a smaller counterbore 78 is also provided in plate 70 which intersects bore 72 to provide a shoulder 76 to receive head portion 82 of mounting bolt 80. A threaded bore 102 in top plate 100 coaxially aligned with bores 72 and 78 receives threaded mounting bolt 80 to secure gas distribution plate 70 to top plate 100 of the processing chamber.

It should be noted that the above described mounting arrangement is not new per se, but rather is used at present with prior art gas distribution plate structures. However, in prior art structures, each bore 72 was provided with an insulated plug to prevent plasma from traveling to the grounded walls of the chamber through the conductive, e.g., stainless steel, mounting bolts in bores 72, or the exposed sidewalls and bottom of bore 72, since the surface of aluminum distribution plate 70 is usually anodized to provide an insulated surface coating on the distribution plate.

However, in accordance with the invention, each bore 72, after the insertion and securement of mounting bolt 80 therein, is provided with a conductive plug 90 which is in electrical communication with either head 82 of mounting bolt 80, or the sidewalls of bore 72, or both, to thereby provide a path to ground or a neutral point for stray plasma currents flowing along the surface of gas distribution plate 70.

Conductive plug 90 may be formed of any type of conductive material which will be non-reactive with the processing being carried out in the chamber, e.g., etching or deposition processes. Preferably, the non-reactive conductive material will be a non-metallic material to minimize any possibility of reaction of the conductive material of plug 90 with gases or other processing materials being used in the semiconductor processing chamber. Examples of such non-reactive non-metallic conductive materials include silicon nitride, silicon carbide, silicon (with or without doping), graphite, and glassy carbon. It should be noted that for purposes of defining the above-described non-reactive, non-metallic, conductive filler material, silicon will be deemed to be non-metallic.

To further illustrate the invention, a 200 mm (8 inch) diameter gas distribution plate was constructed having a non-circular slot pattern of openings therein, in accordance with the invention, similar to that shown in FIG. 4, but with five circles of four arcuate slots each, with the sidewalls of the arcuate slots slanted toward the center of the outer face of the plate at an angle a of about 45°. The midpoints of the respective widths of the five circles of slots had respective diameters of 25.4 mm (1"), 50.8 mm (2"), 76.2 mm (3"), 101.6 mm (4"), and 127 mm (5"). The width of each of the arcuate slots (dimension A+B in FIG. 7) was about 40 mils. This gas distribution plate was installed in a semiconductor wafer processing chamber and used in an etch process with dummy wafers using a halogen-containing gas plasma for a total processing time period of about 24 hours (equal to processing time for about 750–100 wafers). The gas distribution plate was then removed and examined. No evidence of blockage of any of the holes was evident, nor any evidence of any arcing.

Thus, the invention provides a gas distribution plate having a symmetrical pattern of non-circular openings formed therethrough for the passage of gas therethrough to provide for the passage of processing gas therethrough while inhibiting blockage of the openings and arcing on the plate. In a preferred embodiment, at least some of the walls of the non-circular openings are not perpendicular to the plane of the face of the gas distribution plate, but are rather slanted, at an angle of from at least 30° to less than 90°, toward the center or axis of the outer face of the circular gas distribution plate which faces the wafer; and in another preferred embodiment, arcing on the face of the gas distribution plate is further inhibited by providing peripheral conductive means on the face of the gas distribution plate electrically connected to grounded or neutral portions of the processing chamber to thereby provide a conductive neutralization or grounding path for unstable plasma at the surface of the gas distribution plate.

Having thus described the invention what is claimed is:

1. A gas distribution plate for a semiconductor processing apparatus which permits the flow of process gas into said processing apparatus while inhibiting arcing adjacent said plate during plasma processing comprising a plurality of non-circular openings in said gas distribution plate, each of said non-circular openings having:
   a) a width:
      i) smaller than the diameter at which arcing will occur with circular openings; but
      ii) at least about 254 μm (10 mils) to inhibit blockage by a halogen-containing plasma; and
   b) a length greater than said width.

2. The gas distribution plate of claim 1 wherein said plurality of non-circular openings in said gas distribution plate for inhibiting arcing adjacent said plate during said plasma processing further comprises a symmetrical pattern of said non-circular openings in said plate through which gas may flow into said processing apparatus.

3. The gas distribution plate of claim 1 wherein each of said non-circular openings in said plate has a width less than 762 μm (30 mils).

4. The gas distribution plate of claim 1 wherein each of said non-circular openings in said plate has a width of less than about 635 μm (25 mils).

5. A generally circular planar gas distribution plate for a semiconductor processing apparatus having structure for inhibiting arcing adjacent said plate during plasma processing comprising a symmetrical pattern of elongated slots in said plate through which gas may flow into said processing apparatus, each of said elongated slots having a major axis and a minor axis smaller than said major axis, said minor axis having a length:
   a) smaller than the diameter at which arcing will occur with circular openings; and
   b) larger than the diameter at which a halogen-containing plasma will block said circular openings.

6. The gas distribution plate of claim 5 wherein said major axis of at least a portion of said elongated slots intersect a midpoint of said circular plate.

7. The gas distribution plate of claim 5 wherein at least a portion of said non-circular openings comprise elongated slots having a major axis generally perpendicular to a line intersecting a midpoint of said circular plate.

8. The gas distribution plate of claim 7 wherein said elongated slots having a major axis perpendicular to a line intersecting a midpoint of said circular plate comprise arcuate slots lying in one or more circles coaxial to said midpoint.

9. The gas distribution plate of claim 5 wherein a portion of said elongated slots comprise first elongated slots having a major axis intersecting a midpoint of said circular plate; a portion of said elongated slots comprise second elongated slots having a major axis generally perpendicular to a line intersecting said midpoint of said circular plate; and each of said first elongated slots intersects at least one of said second elongated slots.

10. The gas distribution plate of claim 9 wherein said second elongated slots comprise arcuate slots arranged in circles coaxial to said midpoint of said plate.

11. A generally circular gas distribution plate for a semiconductor processing apparatus having structure for inhibiting arcing adjacent said plate during plasma processing comprising a symmetrical pattern of non-circular openings in said plate through which gas may flow into said processing apparatus, each of said non-circular openings having a first dimension smaller than about 762 μm (30 mils) to inhibit arcing, but at least about 508 μ(10 mils) to inhibit blockage by a halogen-containing plasma; and a second dimension larger than said first dimension.

12. The gas distribution plate of claim 11 wherein said non-circular openings comprise a plurality of elongated slots wherein said second dimension of each slot is greater than 762 μm (30 mils).

13. The gas distribution plate of claim 11 wherein said non-circular openings comprise a plurality of elongated slots lying along lines which intersect a midpoint of said circular plate.

14. The gas distribution plate of claim 11 wherein said non-circular openings comprise a plurality of arcuate slots lying in one or more circles coaxial with a midpoint of said circular plate.

15. The gas distribution plate of claim 11 wherein said non-circular openings comprise:
   a) a plurality of elongated slots lying along lines which intersect a midpoint of said circular plate; and
   b) a plurality of arcuate slots lying in one or more circles coaxial with a midpoint of said circular plate;
wherein each of said elongated slots crosses at least one of said arcuate slots.

16. The gas distribution plate of claim 11 wherein said non-circular openings comprise a plurality of crossed elongated slots.

17. A generally circular gas distribution plate for a semiconductor processing apparatus having means for inhibiting arcing adjacent said plate during plasma processing comprising a symmetrical pattern of non-circular openings in said plate through which gas may flow into said processing apparatus, each of said non-circular openings in said plate having a width smaller than the minimum diameter of a circular hole, in a symmetrical pattern of circular holes, at which arcing will occur but larger than the maximum diameter of a circular hole, in a symmetrical pattern of such holes, at which a halogen-containing plasma will block such openings.

18. The gas distribution plate of claim 17 wherein at least a portion of said non-circular openings comprise arcuate slots coaxially arranged around a midpoint on a face of said plate.

19. A generally circular planar gas distribution plate for a semiconductor processing apparatus having means for inhibiting arcing adjacent said plate during plasma processing comprising a symmetrical pattern of non-metallic electrically conductive members arranged on a face of said plate adjacent the periphery, each of said conductive members electrically connected to metallic portions of said plate.

20. A generally circular planar gas distribution plate for a semiconductor plasma processing apparatus to permit the flow of process gas into said processing apparatus while inhibiting arcing adjacent said plate during said plasma processing which comprises symmetrical pattern of non-circular openings in said plate, at least a portion of which said openings comprise elongated arcuate slots having a major axis generally perpendicular to a line intersecting a midpoint on a face of said circular plate, and sidewalls of said arcuate slots parallel to said major axis are slanted toward said midpoint of said plate.

21. The gas distribution plate of claim 20 wherein said sidewalls of said elongated arcuate slots are slanted toward said midpoint at an angle, with respect to said face of said plate, ranging from about 30° to less than 90°.

22. A generally circular planar gas distribution plate for a semiconductor plasma processing apparatus to permit the flow of process gas into said processing apparatus while inhibiting arcing adjacent said plate during said plasma processing which comprises a symmetrical pattern of non-circular openings in said plate, comprising:

a) first elongated slots comprising arcuate slots lying in circles coaxial to a midpoint on a face of said circular plate and having a major axis generally perpendicular to a line intersecting said midpoint on said face of said circular plate; and b) second elongated slots having a major axis intersecting said midpoint on said face of said circular plate, each of said second elongated slots intersecting at least one of said first elongated slots;

wherein said sidewalls of said first elongated arcuate slots parallel to said major axis of said first slots are slanted toward said midpoint of said face on said plate.

23. The gas distribution plate of claim 22 wherein said elongated arcuate slots are arranged in circles coaxial to said midpoint of said face of said plate.

24. The generally circular planar gas distribution plate for a semiconductor plasma processing apparatus of claim 23 wherein said non-circular openings comprising elongated slots have a first dimension smaller than about 762 μm (30 mils) to inhibit arcing; and a second dimension larger than said first dimension.

25. The gas distribution plate of claim 24 wherein sidewalls of said arcuate slots parallel to a major axis of said arcuate slots are slanted toward a midpoint on a face of said plate.

26. A generally circular planar gas distribution plate for a semiconductor plasma processing apparatus to permit the flow of process gas into said processing apparatus while inhibiting arcing adjacent said plate during said plasma processing which comprises:

a) a symmetrical pattern of non-circular openings in said plate; and b) conductive structure on a face of said plate to inhibit arcing on said face of said plate.

27. The gas distribution plate of claim 26 wherein said conductive structure comprise non-metallic means generally symmetrically arranged adjacent the periphery of said circular plate.

28. A generally circular planar gas distribution plate for a semiconductor processing apparatus having structure for inhibiting arcing adjacent said plate during plasma processing comprising a symmetrical pattern of elongated slots in said plate through which gas may flow into said processing apparatus, each of said elongated slots having a major axis and a minor axis smaller than said major axis, said minor axis having a length:

a) smaller than the diameter at which arcing will occur with circular openings; and b) larger than the diameter at which a halogen-containing plasma will block said circular openings;

said elongated slots further comprising:

a) first elongated slots having a major axis parallel to a line intersecting a midpoint of said circular plate; and b) second elongated slots having a major axis perpendicular to said line intersecting said midpoint of said circular plate; and c) each of said first elongated slots intersects at least one of said second elongated slots.

* * * * *